US009153858B2

(12) United States Patent  
Gebert

(10) Patent No.: US 9,153,858 B2  
(45) Date of Patent: Oct. 6, 2015

(54) PORTABLE ELECTRONIC DEVICE WITH PROTECTION AGAINST ELECTROSTATIC DISCHARGE

(71) Applicant: ecom instruments GmbH, Assamstadt (DE)

(72) Inventor: Werner Gebert, Bad Mergentheim (DE)

(73) Assignee: ECOM INSTRUMENTS GMBH, Assamstadt (DE)

( * ) Notice: Subject to any disclaimer, the term of this patent is extended or adjusted under 35 U.S.C. 154(b) by 0 days.

(21) Appl. No.: 14/165,483

(22) Filed: Jan. 27, 2014

(65) Prior Publication Data

US 2014/0210676 A1    Jul. 31, 2014

(30) Foreign Application Priority Data

Jan. 29, 2013    (DE) .......................... 10 2013 201 372

(51) Int. Cl.
*H01Q 1/24* (2006.01)
*H05K 9/00* (2006.01)

(52) U.S. Cl.
CPC ............. *H01Q 1/243* (2013.01); *H05K 9/0067* (2013.01); *Y10T 29/49002* (2015.01)

(58) Field of Classification Search
CPC ..... H01Q 1/243; H05K 9/67; Y10T 29/49002
USPC ..................... 343/702, 872; 455/575.1, 575.7
See application file for complete search history.

(56) References Cited

U.S. PATENT DOCUMENTS

| 2,981,950 | A | 4/1961 | Skidmore |
| 6,531,985 | B1 * | 3/2003 | Jones et al. ................... 343/702 |
| 6,567,047 | B2 * | 5/2003 | Kuck ..................... 343/700 MS |
| 7,518,568 | B2 * | 4/2009 | Tracy et al. .................... 343/873 |
| 7,804,453 | B2 * | 9/2010 | Chiang et al. ................. 343/702 |
| 8,269,677 | B2 * | 9/2012 | Guterman et al. ............ 343/702 |
| 2009/0040115 | A1 * | 2/2009 | Zhang et al. .................. 343/702 |
| 2009/0262029 | A1 | 10/2009 | Chiang et al. |
| 2009/0267266 | A1 | 10/2009 | Lee et al. |
| 2010/0137043 | A1 | 6/2010 | Horimoto et al. |
| 2010/0321253 | A1 | 12/2010 | Ayala Vazquez et al. |
| 2011/0050508 | A1 | 3/2011 | Guterman et al. |

FOREIGN PATENT DOCUMENTS

| DE | 000001156453 | 10/1963 |
| DE | 000004407823 | 9/1995 |
| DE | 19614914 | 10/1997 |
| DE | 102005046306 | 10/2006 |
| DE | 60219274 | 1/2008 |
| DE | 102011003978 | 8/2012 |
| EP | 1841004 | 10/2007 |

* cited by examiner

*Primary Examiner* — Tho G Phan  
(74) *Attorney, Agent, or Firm* — Renner, Otto, Boisselle & Sklar, LLP.

(57) ABSTRACT

The present invention relates to a portable electronic device with static charge protection, which is particularly suitable for use in areas exposed to explosion hazards and not limited in its functions therein. The portable electronic device comprises a transmission module having an antenna, and a housing, accommodating the transmission module and the antenna, wherein at least part of the housing has such a frame structure of frame elements of anti-static material with areas of another material placed there in-between that the radiation of the antenna goes essentially through the areas and not through the frame elements of anti-static material.

11 Claims, 6 Drawing Sheets

PORTABLE ELECTRONIC DEVICE WITH PROTECTION AGAINST ELECTROSTATIC DISCHARGE

FIELD OF THE INVENTION

The present invention relates to a portable electronic device with static charge protection, which is particularly suitable for use in areas exposed to explosion hazards, as well as a method for producing the same.

PRIOR ART

As known, electrostatic discharges can be caused, for example, by people who when walking on a carpet obtain static charges due to friction electricity. Thereby, voltages of several thousands of volts can be achieved. This electrostatic charge leads to problems, for example, when this person works with sensitive electronics, for example maintaining and using computer technology.

In the same way as people can be charged electrostatically, electronic devices can be charged, for example when a charged person touches such a device or if the device is simply wiped with a cloth. Electrostatic charges of a housing of an electronic device may already occur when pulling it out of a pocket, whereby electrons, negative charges, can be stripped off so that the device builds up charges.

While people in everyday life merely are briefly surprised when charges present on them are discharged when touching a grounded object, e.g. a radiator, this may cause when handling computer circuits the destruction of integrated circuits, particularly MOSFETs.

More severe results may arise from electric discharges in areas exposed to explosion hazards, for example in mines, chemical factories, gas stations, etc. A spark or breakdown, i.e. an electrostatic discharge, initiated by a potential difference may there lead to an ignition or explosion of gas, such as mine gas. Mine gas mainly consists of methane and can be ignited easily. Therefore, suppressing a spark created through electric discharge in areas exposed to explosion hazards, such as in the EX-area (Zone 1), is of utter importance.

A possibility to provide a certain protection against electric discharge is to equip electronic devices with an anti-static housing. However, such housings may lead to impairment of a function of the electronic device. These housings have to be protected reliably against dust and moisture and have to be stable and meet different strains and requirements in the work space. In electronic devices which rely on data transmission via radio using an electromagnetic wave, such devices however lead to the problem that transmitted electromagnetic waves or electromagnetic waves to be received are strongly attenuated which may lead to malfunctions or erroneously received/sent data.

SUMMARY OF THE INVENTION

The object of the invention is to provide an electronic device with static charge protection which however is not limited in its functions.

This object is achieved by an electronic device with static charge protection having the features of claim 1. Advantageous embodiments are described in the dependent claims.

According to an embodiment, the portable electronic device with static charge protection comprises a transmission module having an antenna and a housing accommodating, inter alia, the transmission module and the antenna. The portable electronic device is adapted so that at least a part of the housing has such a frame structure of frame elements of anti-static material with areas of another material in between that the radiation of the antenna is substantially passing through the areas and not through the frame elements of anti-static material. Therefore, a stable housing for a portable electronic device protected against static discharges may be provided, which does not negatively influence the functions of the device and particularly does not substantially effect electromagnetic waves to be transmitted or to be received, by adapting the housing structure to the radiation of one or more antennas in the device.

According to an preferred embodiment, the housing of the portable electronic device comprises areas of the other material which are 20 $cm^2$ at maximum. Preferably these areas lying in between the frame elements are 4 $cm^2$ at maximum. Therefore, particular areas of the housing of the device may be reduced to a size, on which not enough charges may accumulate to effect such discharge which could cause an explosion by a spark in an environment exposed to explosion hazards.

According to another preferred embodiment, the housing comprises at least two and preferably at least three areas of the other, i.e. non-anti-static or less anti-static material. Therefore, windows for transmission or reception may be provided in the housing not noticeably influencing a transmission characteristic of the antenna or antennas negatively and not impairing the functions of the device.

According to another preferred embodiment, the at least two areas are arranged at the backside of the device and/or two areas at the sides of the device. Alternatively, one area may be provided on the backside and one area on each one of both of the sides. Therefore, efficient radiation in different spatial directions can be achieved.

According to another preferred embodiment, the anti-static material comprises a plastic material with filler materials for providing an anti-static characteristic. Therefore, simple processing is enabled and cheap material for a portable electronic device can be used which is further insensitive against moisture, dust and shocks.

According to another preferred embodiment, the resistance of the anti-static material is smaller than $10^{11}$ Ohm and preferably smaller than $10^9$ Ohm. Therefore, an anti-static material is selected which has a resistance smaller than the other material of the areas between the frame elements, and charging the housing is suppressed so that individual charges do not present a danger in an environment exposed to explosion hazards, for example.

According to another preferred embodiment, the frame elements, i.e. all frame elements of the frame structure of the device, form an interconnected mesh effecting an integrated conductance between the frame elements. Therefore, no charge may accommodate on individual elements and particularly no potential differences may occur.

According to another embodiment, the frame structure is adapted so that the user contacts when using the portable electronic device normally at least one frame element. For example, frame elements are provided on the backside of the device, which lies in the user's hand or frame elements are provided at the handle of the device. Therefore, a user connected to ground may at the same time also connect the housing of the device to ground by providing the possibility of discharging charges from the device.

According to another embodiment, radiation of the antenna and the frame structure are adapted to each other so that the main radiation direction of the antenna is passing through areas with the other material. Therefore, attenuation of a transmitted electromagnetic wave may largely be avoided.

According to another preferred embodiment, the device constitutes at least one of a portable computer or laptop, a personal digital assistant (PDA), a mobile telephone, a measurement and/or calibration device, a barcode scanner, a digital camera and a tablet computer. Accordingly, different portable electronic devices may be adapted according to the inventive teaching and may be employed securely in environments exposed to explosion hazards.

Another embodiment relates to a method for producing a portable electronic device with static charge protection, comprising the steps providing a portable electronic device having a transmission module, antenna and housing, and attaching on at least a part of the device a frame structure of frame elements of anti-static material with areas located in between without material or another material so that the radiation of the antenna goes through the areas and not through the frame elements of anti-static material.

Further advantageous features of the invention are disclosed in the detailed description of the embodiments and the claims.

BRIEF DESCRIPTION OF THE DRAWINGS

In the following, the invention will be discussed in detail by referring to the accompanying drawings.

DETAILED DESCRIPTION OF THE PREFERRED EMBODIMENTS

Preferred embodiments of the present invention will be described in detail in the following by referring to the accompanying drawings. Same or corresponding elements in the different Figures are denoted with same or similar reference signs.

The preferred embodiments of the invention, which are described in detail in the following, are described in detail with respect to a portable electronic device with six side faces and a transmission module. However, it is noted that the present invention includes only examples and should not be regarded as limiting the invention. For example, the portable electronic device may have another housing of a different form with a different number of side faces and several transmission modules or one transmission and reception module as well as an arbitrary number of antennas.

Figure 1A:
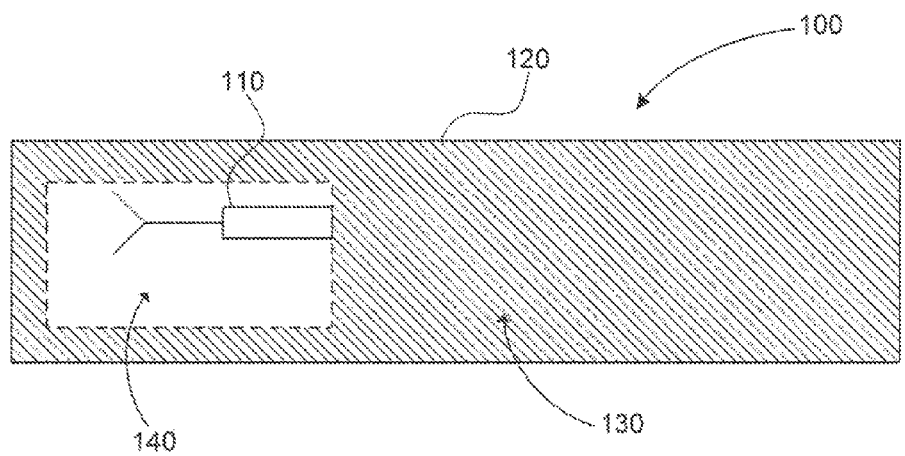
FIGS. 1a and 1b show side and back views, respectively, of a portable electronic device according to an embodiment.
Figure 1B:
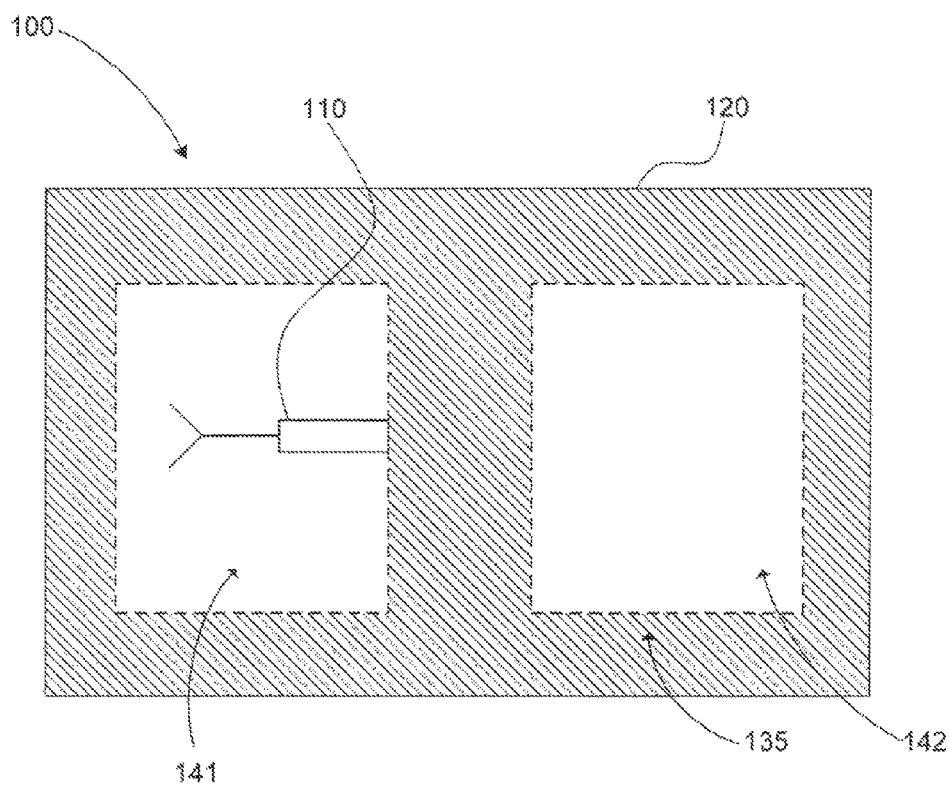

FIGS. 1a and 1b show a side view and back view, respectively of the electronic device 100. By hatched and non-hatched areas the different materials in the construction of the housing 120 of electronic device 100 are illustrated which is explained more in the following.

In detail, FIG. 1a shows elements of a portable electronic device to be used in environments exposed to explosion hazards. The construction of the device provides protection against static charges and discharges. Therefore, a housing is used which comprises frame elements of anti-static material. As shown, the device 100 comprises a transmission module 110, which may be adapted as transmission and reception module (transceiver module). This module 110 has an antenna for communicating with other devices, such as for transmitting data to a computer or receiving of instructions from a computer.

In FIG. 1a, the housing 120 is shown in a side view. On the shown side, the housing has a frame structure with frame element 130 (with hatches in FIG. 1a), consisting of anti-static material, and an area 140 (which is drawn transparent) consisting of another material. As shown, the other area is arranged such that possible radiation of an antenna connected to the transmission module can go through this area.

Similarly, the back view of device 100 shown in FIG. 1b shows that the housing 120 has also a frame element 135 as part of the frame structure, which consists of anti-static material, as well as shows areas 141, 142 located between the frame elements. Since the areas 141, 142 are draw transparently, like in FIG. 1a, it is also evident that a transmission module 110 having an antenna is arranged in the housing such that radiation of the antenna particularly goes through the left area 141.

It can be seen from FIGS. 1a and 1b that at least part of the housing 120 comprises such a frame structure of frame elements 130, 135 of anti-static material with areas 140, 141, 142 of another material located there in-between that the radiation of the antenna of the transmission module 110 goes substantially through the areas 140, 141 and not through the frame elements of anti-static material. Due to the positioning of the antenna in this example, it is also evident that the area 142 can be left out, i.e. the area could also be replaced by anti-static material.

In particular, the frame structure may extend over all sides of the portable electronic device 100 and may consist of several frame elements, e.g. side elements, of anti-static material. Thereby, a mesh type structure is formed around the device. The area located between the frame elements, i.e. areas without anti-static material, consist of another material which does not have anti-static characteristics or much weaker anti-static characteristics compared to the frame elements, and thus windows for radiating electromagnetic waves are formed.

This other material is, for example, a normal plastic material used for housing of electronic devices, which plastic material is substantially transparent for electromagnetic radiation with frequencies used in telecommunications technology. As shown, the frame elements are arranged such that they influence the radiation only insignificantly which will be shown in the following in more detail with respect to FIG. 6.

In contrast thereto, the anti-static material is a material which has a smaller resistance than the other material and thus conducts charges so that they can be discharged or diverted so that no or only minimal surface charges can be formed. This anti-static characteristic, i.e. avoiding of static charging, can be achieved by a filler material in the plastic material, for example.

In one embodiment, anti-static material is obtained from plastic material having filler material for effecting the anti-static characteristic. As filler material soot or different salts are used, for example, whereby the resistance of the anti-static material can be easily set depending on the dosage of the filler material.

The resistance of the anti-static material should be selected smaller than $10^{11}$ Ohm and preferably smaller than $10^9$ Ohm.

The resistance values to be selected are thereby dependent on the application environment. Thereby, it has been shown that with higher humidity a resistance of $10^{11}$ ohm is sufficient to satisfy the above-described protection function. On the other hand, with low humidities or if the humidity fluctuates a lot, a resistance of roughly $10^9$ Ohm should be selected at maximum. Certainly, when selecting a small or smaller resistance than $10^9$ Ohm, a coarser mesh, i.e. frame structure, can also be used. In other words, the designer selects a good compromise between resistance of anti-static material and the size of the areas located in between which would be explained in more detail in the following.

In contrast to the resistance of the anti-static material, the resistance of the other material, which may preferably be a plastic material, can be larger than $10^{12}$ Ohm due to the frame structure, and is usually in the range of $10^{12}$ to $10^{15}$ Ohm.

To limit the surface charge accumulated on the other areas effectively, the size of each area located between the frame elements is selected not larger than, i.e. at most, 20 cm². It has been shown that this area size provides effective protection against discharges, particularly in the Ex-region of zone 1. That is, for example, in the case of portable computers (Laptops) several areas with the size of up to 20 cm² may occur to provide certain protection against steady charge/discharge. These areas should, however, not be connected with each other so that by separating the same, it is ensured that surface charges of individual areas are not added. Due to the necessity of separating or isolating of individual areas, the frame elements are provided which cover the housing like a mesh, and individual windows of the other material allows areas of limited size.

If very high requirements on avoiding charging an area are present, such as in highly explosive environments or/and the resistance of the anti-static material is in the above-described upper range, the areas can preferably also be selected to be 4 cm² at most. The advantage with the mesh type formation of the frame structure of the housing is that arbitrary area sizes can be produced in a simple way.

As described with respect to FIGS. 1a and 1b, the housing comprises at least two and preferably at least three areas of the other material. For example, two areas can be placed on the backside of the housing, as shown in FIG. 1b. Further, one area each may be provided on each one of the two side faces, as shown in FIG. 1a. To cover several spatial directions, it is according to FIGS. 1a and 1b also possible to provide one area 140 on each one of the two side faces as well as to provide one area 141 on the backside of the housing, so that three areas of the other material enable an almost unlimited radiation in at least a 180° range. The influence on the radiation of the two frame elements which separate the 180° region in three areas, is negligible.

Depending on how many reception and/or transmission modules and antennas are used or in case of complex radiation characteristics, it may be advantageous to arrange several areas on the backside of the device, e.g. two and/or more areas on the side faces of the device. Certainly, such areas may also be arranged at the upper and lower side or on the front face of the device.

Figure 2:
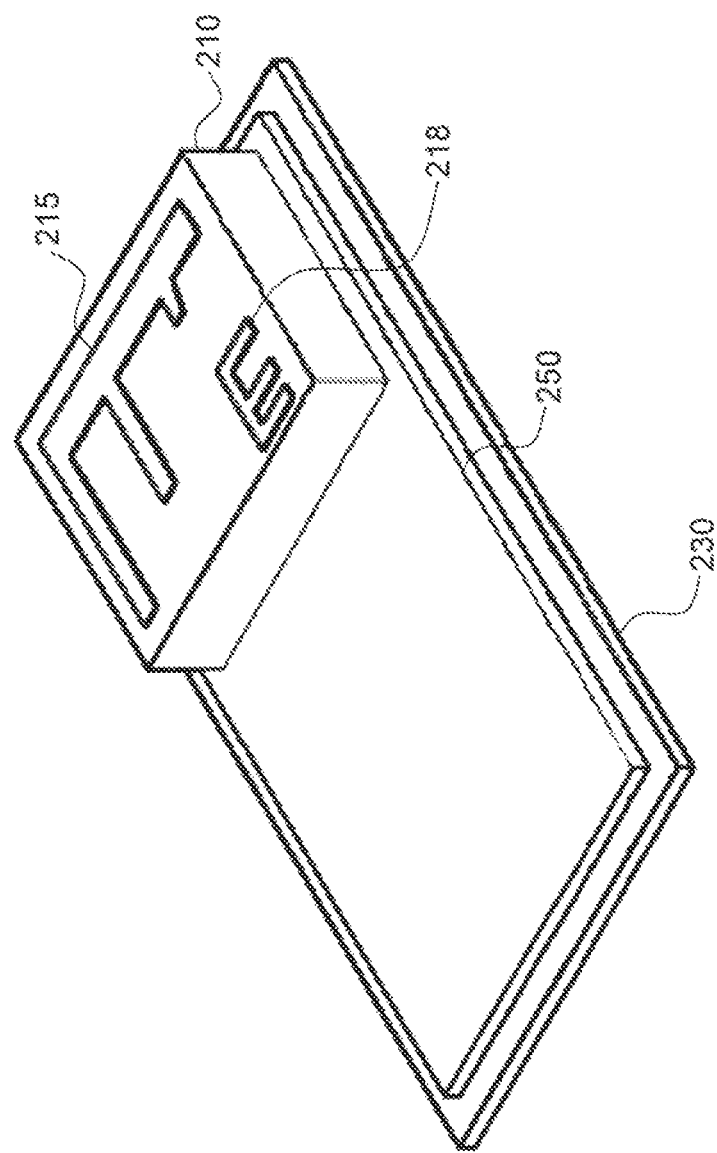
FIG. 2 shows a transmission module having an antenna of a portable electronic device.

FIG. 2 shows a concrete example of a transmission module 210 having two antennas 215 and 218, which may be accommodated by the housing of the above described portable electronic device. In this example, the transmission module 210 is arranged on a carrier 250, e.g. a printed circuit board. This carrier 250 is placed in turn on a plate 230 forming, for example, a part of the housing, e.g. the front face of the housing. In this example, a PIF antenna (Planar Inverted F-Shaped Antenna) is used which is a compact antenna which, inter alia, is used in mobile telephones and which may be produced to be small, flat, effective and cheap. This type of antenna is thus suitable to be used in portable electronic devices.

Figure 3:
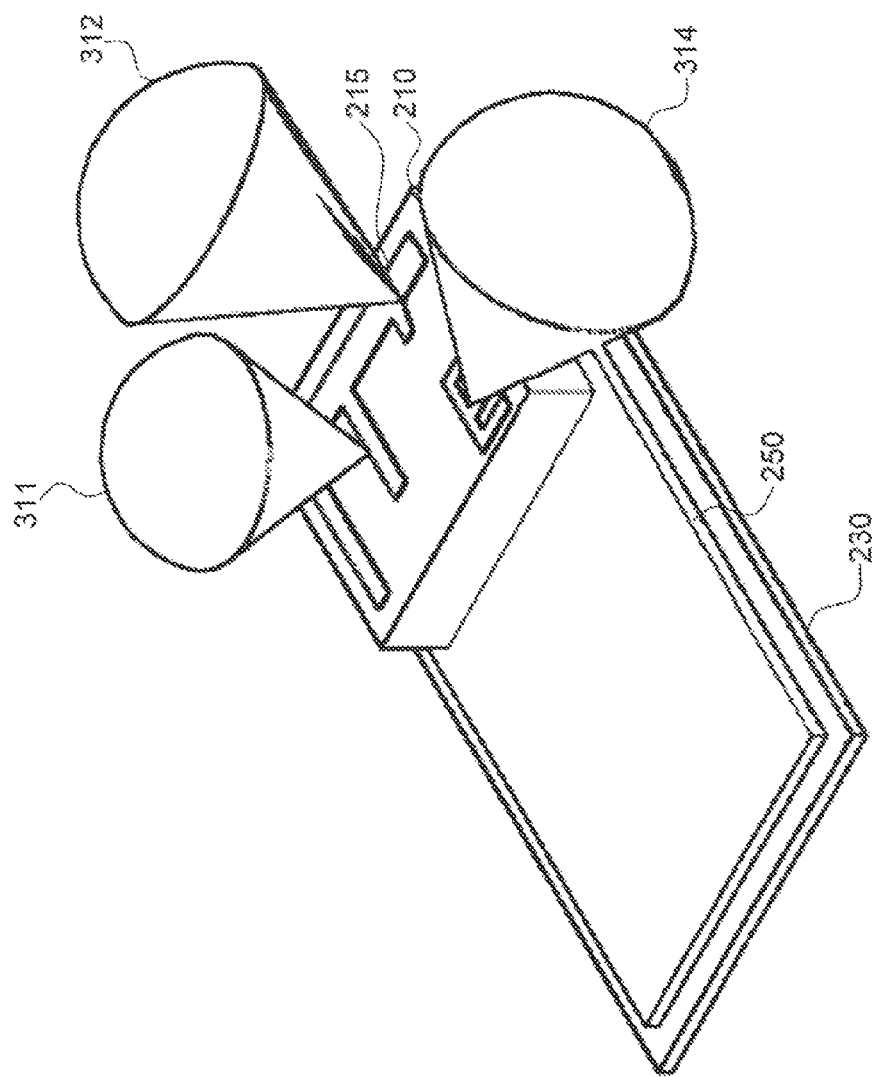
FIG. 3 shows the radiation characteristics of the antenna and/or antennas of FIG. 2.

In FIG. 3 different radiation characteristics of the antennas shown in FIG. 2 are illustrated. Thereby, in particular, main radiation directions, i.e. main lopes, of these antennas are shown. The lopes 311 and 312 are assigned to antenna 215 and the lope 314 is assigned to antenna 218.

The skilled person recognizes that radiation characteristics in the figures are shown for illustration in exaggerated form and usually they are not as strongly directional but more in the form of a potato or egg. It should be understood that on some positions a radiation is not necessary or not desired, and thus the anti-static material may be provided there, such as on the speaker part or microphone part of the mobile telephone.

Figure 4:
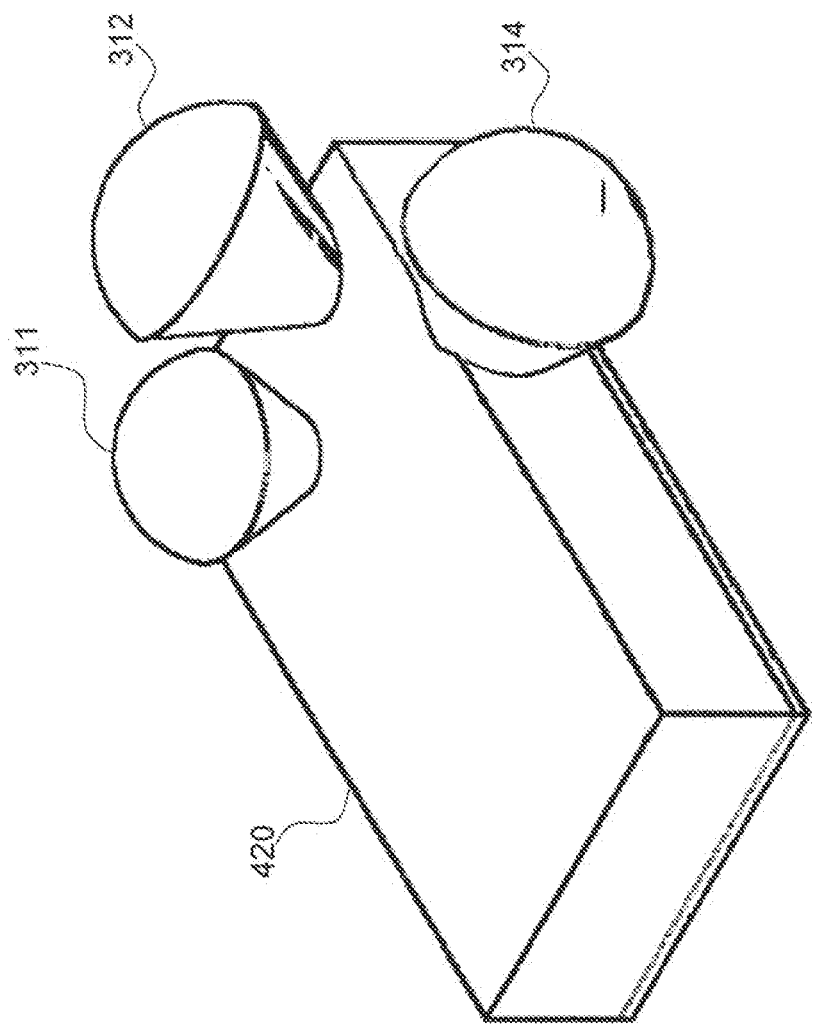
FIG. 4 shows the radiation characteristics of antennas of a transmission module in a housing.

In FIG. 4, a complete housing 420 accommodating the antennas and transmission module is shown, and it is shown how radiation through such a housing would occur. Assuming that the housing 420 is completely produced from anti-static material, this would lead to significant attenuation or damping of the radiated electromagnetic waves, which would lead to the above-described function deteriorations. For example, the operating range of the radio signal would be drastically shortened and the signal-to-noise-ratio would be deteriorated due to the attenuation, which would lead to erroneous transmissions of data.

Figure 5:
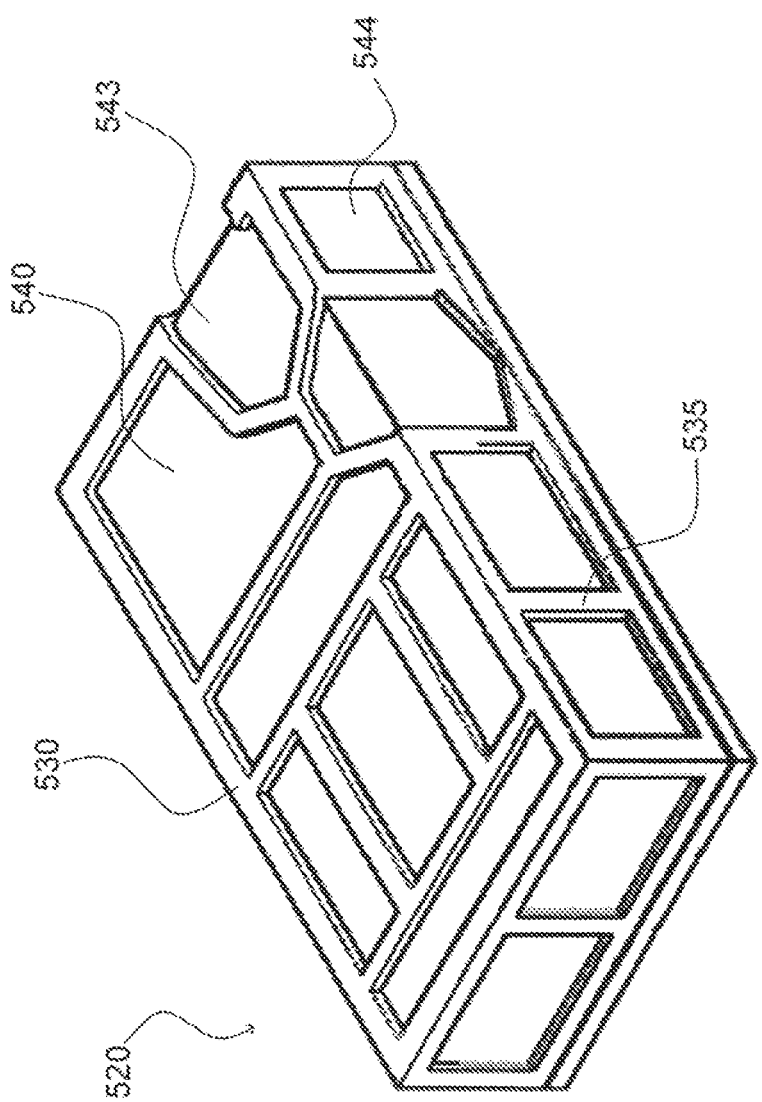
FIG. 5 shows a housing having a frame structure of frame elements of anti-static material according to an embodiment.

FIG. 5 shows a frame structure of a housing of a portable electronic device according to an embodiment of the invention. Different frame elements 530 are shown on the backside, lower side and side faces. In particular, several areas located between the frame elements are shown in FIG. 5, e.g. the areas 540, 543, 544, which consist of a material which allows electromagnetic waves to go through without noticeable attenuation.

The frame structure of the frame elements 530 and 535 forms a continuous, i.e. integrated, mesh, in other words, the frame elements are all connected with each other. Therefore continuous conduction between the frame elements is effected so that charges can be discharged or diverted and charges cannot accumulate on individual elements, whereby potential differences between the elements could be produced. Additionally, the areas are dimensioned such that they are not larger than 20 cm², whereby the possible surface charge on the areas can be limited.

From the shown type of frame structure, it is readily apparent that a user, when regularly using the portable electronic device, i.e. when taking the housing 520 in his hand, the user contacts at least one frame element. Since these frame elements are all connected with each other, the user may function as providing a grounding for the housing, which is particularly advantageous if the user himself is grounded.

By using plastic material for the housing, simple injection moulding methods can be used to create all types of frame structures, which are thus adaptable in any order to the radiation characteristics of the antennas used in the device. For example, first the part of the overall housing 520 consisting of the other material can be produced and then it can be covered with the frame structure shown in FIG. 5 which can discharge or divert the accumulated charges on the areas due to their low resistance.

Figure 6:
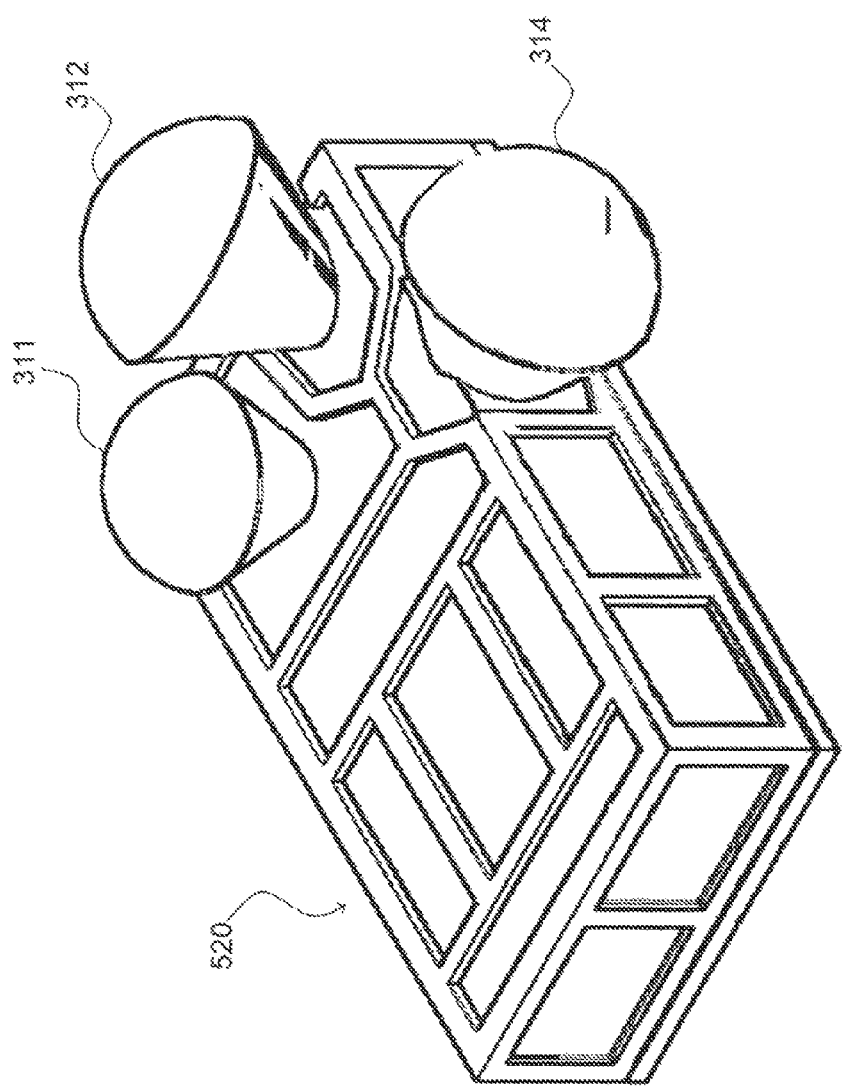
FIG. 6 shows how the frame structure of the housing of FIG. 5 is suitably selected for the radiation characteristics of the antenna radiations of FIGS. 3 and 4.

In FIG. 6 radiation lopes 311, 312 and 314 of FIGS. 3 and 4 are superimposed on the housing 520 of FIG. 5. Thereby, it is seen that the frame structure with frame elements 530 and 535 of FIG. 5 were suitably selected so that the radiation lopes mainly go through the non-anti-static areas and thus are not negatively influenced by the frame elements. In other words, the radiations of the antenna or antennas and the frame structure are adapted to each other so that a main radiation direction, e.g. the main lope, goes through an area with the other material.

Therefore, there is a dependency between the antenna shape and the thus resulting radiation characteristics of the antenna and the type of the frame structure to be used for the housing. Thus, the designer of the device has to meet requirements of the radio technology (positioning of the antenna and radiation characteristics thereof) and requirements of the anti-static.

From the above discussion it is clear that it is also possible, in particular due to knowledge of the radiation characteristics of the antenna and the possibility of a simple production of a frame structure of anti-static material, to produce for existing devices, which are not provided with protection against static charges, respective frame structures, which may then be arranged on an existing housing of the device.

Accordingly, a retrofitting process can be used for producing a portable electronic device providing protection against static charging/discharging. Thereby, in a first step, a conventional portable electronic device having a transmission module, antenna and housing, is provided as well as a frame structure, which is formed mesh-like with frame elements of anti-static material and areas without material located there in between or with material of smaller conductivity, i.e. higher resistance, located in between.

Then, the frame structure is placed on at least a part of the housing, e.g. by gluing or screwing or simply stretching the same over the housing. Thereby, the frame structure of frame elements of anti-static material with areas located in between without material or of a different material is arranged on the housing such that the radiation of the antenna goes substantially through the areas and not through the frame elements of anti-static material. For example, in the region of the antenna, less and smaller frame elements are used as in other positions. Different materials, such as specific foils or plastic materials adapted to the resistance can be used for producing the frame structure.

Portable electronic devices, which should have a housing according to the above discussion, or which could be retrofitted accordingly, comprise portable computers or laptops, personal digital assistants, mobile telephones, measurement and/or calibration devices, barcode scanners, digital cameras and tablet computers.

For example, use of barcode scanners is also desired in factories with environments exposed to explosion hazards, wherein the barcode scanner may acquire a barcode in the production and the read out information may then be readily sent wirelessly by electromagnetic waves to a computer system in real time, e.g. via WLAN, Bluetooth or any other communication technology. The same holds for measurement data, which is acquired from measurement and/or calibration devices and which have to be transmitted to a computer system for real time or near real time processing.

From the above description, the skilled person appreciates that different modifications and variation of the device are possible without departing from the scope of the invention defined by the claims. Further, the invention has been described with respect to specific examples which, however, should only serve for better understanding the invention and should not limit the same. The skilled person appreciates that several different combinations of the described elements may be used for carrying out the present invention. Therefore, the true scope of the invention is characterized the following claims.

The invention claimed is:

1. Portable electronic device with static charge protection for use in explosion-hazardous areas, comprising
   a transmission module having an antenna, and
   a housing accommodating the transmission module and the antenna, wherein
   at least a part of the housing has a frame structure of frame elements of anti-static material with areas of another material located there in-between, so that the radiation of the antenna substantially goes through the areas and not through the frame elements of anti-static material,
   the size of each area is at most 20 cm$^2$,
   at least two areas are arranged at the backside of the device and at least two areas are arranged on the side faces of the device,
   the anti-static material is a plastic material having filler material for effecting the anti-static characteristic, and
   the resistance of the anti-static material is smaller than $10^{11}$ Ohm.

2. Portable electronic device according to claim 1, wherein the housing comprises at least two areas of the other material.

3. Portable electronic device according to claim 2, wherein the housing comprises at least three areas of the other material.

4. Portable electronic device according to claim 1, wherein the frame elements of the frame structure of the device form an integrated mesh which effects a continuous conductivity between the frame elements.

5. Portable electronic device according to claim 1, wherein the frame structure is adapted such that a user when normally using the portable electronic device contacts at least one frame element.

6. Portable electronic device according to claim 1, wherein the radiation of the antenna and the frame structure are adapted to each other so that the main radiation direction goes through an area with the other material.

7. Portable electronic device according to claim 1, wherein the device constitutes at least one of a portable computer or laptop, a personal digital assistant, a mobile telephone, a measurement device, a calibration device, a barcode scanner, a digital camera or a tablet computer.

8. Portable electronic device according to claim 1, wherein the size of each area is at most 4 cm$^2$.

9. Portable electronic device according to claim 1, wherein at least two additional areas are arranged on the side faces of the device.

10. Portable electronic device according to claim 1, wherein the resistance of the anti-static material is smaller than $10^9$ Ohm.

11. Method for producing a portable electronic device with static charge protection for use in explosion-hazardous areas, comprising the steps:
    providing a portable electronic device having a transmission module, antenna and housing, and
    applying on at least a part of the device a frame structure of frame elements of anti-static material with areas without material or another material located there in-between, so that the radiation of the antenna substantially goes through the areas and not through the frame elements of anti-static material, wherein
    the size of each area is at most 20 cm$^2$,
    at least two areas are arranged at the backside of the device and at least two areas are arranged on the side faces of the device,
    the anti-static material is a plastic material having filler material for effecting the anti-static characteristic, and
    the resistance of the anti-static material is smaller than $10^{11}$ Ohm.

\* \* \* \* \*